United States Patent [19]

Kupfer

[11] Patent Number: 4,736,457

[45] Date of Patent: Apr. 5, 1988

[54] CIRCUIT ARRANGEMENT FOR A TUNER FOR CHANGING OVER TWO FREQUENCY BANDS

[75] Inventor: Karl-Heinz Kupfer, Krefeld, Fed. Rep. of Germany

[73] Assignee: U.S. Philips Corporation, New York, N.Y.

[21] Appl. No.: 838,507

[22] Filed: Mar. 11, 1986

[30] Foreign Application Priority Data

Mar. 16, 1985 [DE] Fed. Rep. of Germany ....... 3509517

[51] Int. Cl.$^4$ .............................................. H04B 1/16
[52] U.S. Cl. .................... 455/188; 455/190; 455/339; 455/340; 334/14; 334/47
[58] Field of Search .............. 455/180, 188, 189, 190, 455/191, 339, 340; 334/15, 11, 14, 47; 358/191.1

[56] References Cited

U.S. PATENT DOCUMENTS

| | | | |
|---|---|---|---|
| 3,696,302 | 10/1972 | Gossard | 455/189 |
| 3,727,140 | 4/1973 | Rodrigalvarez Nieto et al. | 455/189 |
| 4,118,679 | 10/1978 | Hiday et al. | 455/180 |
| 4,326,295 | 4/1982 | Matsumoto et al. | 455/180 |
| 4,397,037 | 8/1983 | Theriavlt | 455/339 |
| 4,408,348 | 10/1983 | Theriavlt | 455/180 |
| 4,418,428 | 11/1983 | Evans | 455/180 |

Primary Examiner—Robert L. Griffin
Assistant Examiner—Elissa Seidenglanz
Attorney, Agent, or Firm—Thomas A. Briody; William J. Streeter; Gregory P. Gadson

[57] ABSTRACT

The invention relates to a circuit arrangement for a tuner, particularly a television tuner, for a change over switching between two frequency bands with the aid of a switching diode, said frequency bands, particularly the VHF band and the hyperband, being filtered out by means of bandpass filters (1,7). The bandpass filters have at their inputs and outputs capacitance diodes for the purpose of tuning. The filtered signals are applied to a common tunable circuit (15) on the secondary side of the bandpass filters. The bandpass filter for the hyperband is constructed and dimensioned such that the signal is switched through by means of a switching diode (83) arranged at the low end of the bandpass filter (1). When this diode (83) is conducting a smaller output reactance, whereas in the case of a blocking switching diode (83), this bandpass filter (1) cuts off the signal and has a larger output reactance. Furthermore, the bandpass filter (7) for the VHF band is constructed and dimensioned such that it filters out the desired frequency range in the case of a larger output reactance of the first bandpass filter (1) and is detuned in the case of a smaller output reactance of the first bandpass filter (1).

7 Claims, 1 Drawing Sheet

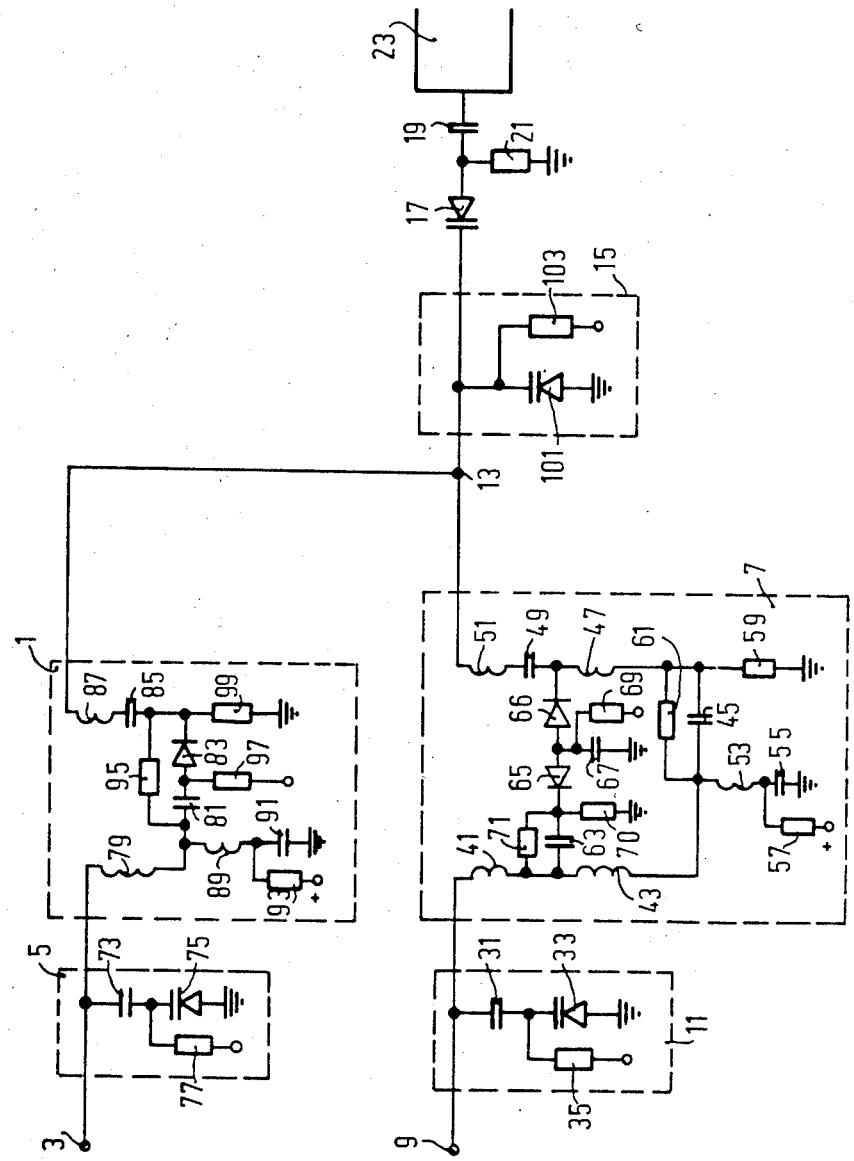

CIRCUIT ARRANGEMENT FOR A TUNER FOR CHANGING OVER TWO FREQUENCY BANDS

BACKGROUND OF THE INVENTION

1. Field of the Invention

The invention relates to a circuit arrangement for a tuner, particularly a television tuner, for a change over switching between two frequency bands with the aid of switching diodes, said frequency bands being filtered out by means of band-pass filters having at their inputs and outputs tuning capacitance diodes, the switching diodes of said two bandpass filters being alternately forward-biased.

2. Brief Description of the Prior Art

In circuit arrangements of this type it is known to provide a tunable circuit with a capacitance diode at each input and output of each band-pass filter. The secondary sides of the bandpass filters are then connected to inputs of a mixer, generally an integrated mixercircuit. A switching possibility for the output signals of these bandpass filters must be provided at these inputs, because only the the signal of one of the bandpass filters should reach the mixer. These circuit arrangements generally comprise switching diodes which are rendered conducting by means of a switching signal so that the output signal of the bandpass filter is short-circuited to ground.

A tuned input stage for three frequency bands is known, for example, from U.S. Pat. No. 4,408,348 which has three tunable filters for each of the three frequency bands. At the inputs and outputs of each of the three filters, tunable circuits, each having a capacitance diode are provided.

Furthermore a tunable resonant circuit for at least two frequency ranges is known from DE-AS No. 25 03 785 in which, for example, a common tunable resonant circuit is provided for the frequency ranges UHF, VHF I and VHF III. However, in this resonant circuit the highest band, in this example the UHF band, is continuously operative. This results in an interference signal being produced in the UHF range, for example, in the case of reception in the UHF III band owing to the occurrence of harmonics, which interference signal, likewise as the wanted signal reaches the mixer.

SUMMARY OF THE INVENTION

It is an object of the invention to provide a circuit arrangement for a switchable operation of each of a plurality of bandpass filters, in which only one frequency range is passed through, providing for a simple and economic structure as far as switching and tuning of the bandpass filters is concerned.

According to the invention this object is solved in that the signals after passing through the bandpass filters are applied to a common tunable circuit on the secondary side the operation of combining the signals being effected such that the first bandpass filter passes the signal through by means of a switching diode arranged at the low end of the bandpass filter when this diode is conducting and has a smaller output reactance, whereas the bandpass filter, when said diode is blocking, cuts off the signal and has a larger output reactance, and the second bandpass filter filters out the desired frequency range in the case of a larger output reactance of the first bandpass filter and is detuned in the case of a smaller output reactance of the first bandpass filter.

For such a circuit arrangement it is sufficient to have only one tunable circuit on the secondary side. Furthermore a switching unit is omitted due to the switching diode being arranged at the low end of the first bandpass filters and due to the construction of the bandpass filters. Since the output signals of the bandpass filters are applied to a common tunable circuit on the secondary side, only one mixer input is required.

In spite of the simple structure the frequency ranges cannot be mutually influenced because only one bandpass filter is always operative. For example, possible harmonics are filtered out during operation in the low-frequency band range because the bandpass filter for the higher frequency band range is then cut off.

This is achieved in that a bandpass filter is arranged in a switchable manner so that it is either operative and has a smaller output reactance, or is cut off and has a larger output reactance. At the larger output reactance of the first bandpass filter the second bandpass filter operates in the desired frequency range, but is detuned when the first bandpass filter has a smaller output reactance. In this manner it is ensured, despite a simple change-over switching, that the two bandpass filters never pass the respective frequency band simultaneously.

The circuit arrangement for a tuner is particularly suitable for the filtering and the change-over switching of the VHF frequency band and the hyperband, respectively. To this end a known arrangement for changing over between the two VHF ranges may be provided in the VHF bandpass filter. The circuit arrangement may, however, also be used for other frequency ranges.

According to a further embodiment of the invention there is provided that:

a series arrangement of a switching diode and a capacitor is disposed between the capacitor and an inductor in such a way that the anode of the switching diode is connected to the capacitor, a switching voltage is applied to the anode of the switching diode via a resistor, the cathode of the switching diode is connected to ground via a resistor, a resistor is arranged in parallel with the capacitor and the switching diode.

This circuit arrangement provides the above-described advantages using low-cost elements. Besides only very small changes as compared with the existing circuit concepts of bandpass filters are to be carried our because only few additional elements can be integrated in the bandpass filters.

BRIEF DESCRIPTION OF THE DRAWING

The FIGURE shows the circuit arrangement for the tuner.

DETAILED DESCRIPTION OF THE PREFERRED EMBODIMENT

An embodiment of the circuit arrangement according to the invention will be further described with reference to the FIGURE.

The upper part of the FIGURE shows a bandpass filter 1 of the hyperband to whose input 3 a tunable circuit 5 is connected. The lower part of the FIGURE shows a VHF bandpass filter 7 also having a tunable circuit 11 at its input 9. The outputs of the two bandpass filters 1 and 7 are connected to a common point 13 to which a common tunable circuit 15 on the secondary side is connected. This point 13 is also coupled via a capacitance diode 17 and a coupling capacitor 19, between which a resistor 21 is connected to ground, to an input of a mixer 23 which will generally be an integrated mixer circuit. The tunable circuit 11 arranged at the input of the VHF bandpass filter 7 comprises the series arrangement of a capacitor 31 and a capacitance diode 33 whose anode is connected to ground. A tuning voltage is applied to the cathode of the capacitance diode 33 via a resistor 35. The VHF bandpass filter 7 comprises the series arrangement of a first inductor 41, a second inductor 43, a capacitor 45, a third inductor 47, a capacitor 49 and a fourth inductor 51. At the low end of the bandpass filter an inductor 53 is coupled to ground via a capacitor 55 at one end, and at the other end via a resistor 57 for the voltage supply, from the junction of the inductor 43 and the capacitor 45. Furthermore a resistor 59 is connected to ground and a further resistor 61 is connected to the junction between the inductor 43 and the capacitor 45, from the junction of the capacitor 45 and the inductor 47. For operation in the range III of the VHF band a series arrangement of a capacitor 63 and two switching diodes 65 and 66 is connected from the junction between the first inductor 41 and the second inductor 43 to the junction between the third inductor 47 and the capacitor 49. The anodes of the switching diodes 65 and 66 are connected to each other and to a grounded capacitor 67 as well as to a resistor 69, which is connected to a switching voltage for switching on the B III range. A resistor 70 is connected to ground from the cathode of the switching diode 65. A resistor 71 is arranged in parallel with the capacitor 63.

The tunable circuit 5 on the primary side of the hyperbandpass filter 1 comprises a capacitor 73, a capacitance diode 75 and a resistor 77, in conformity with the tunable circuit 11. The hyperbandpass filter comprises a series arrangement of an inductor 79, a capacitor 81, a switching diode 83, a further capacitor 85 and an inductor 87, the cathode of the switching diode being connected to the capacitor 85. At the low end of the bandpass filter an inductor 89 is connected from the junction of the inductor 79 and the capacitor 81 to a grounded capacitor 91 and via a resistor 93 to the voltage supply. A resistor 95 is arranged in parallel with the capacitor 81 and the switching diode 83. A switching voltage is applied to the anode of the switching diode 83 via a resistor 97. The cathode of this switching diode 83 is connected to ground via a resistor 99.

The secondary side of the two bandpass filters 1 and 7 are coupled to the common point 13 to which the common tunable circuit 15 is connected. In this tunable circuit 15 the cathode of a capacitance diode 101 is connected to the point 13 and its anode is connected to ground. The tuning voltage is applied via a resistor 103 to the cathode of the capacitance diode 101.

As described above the point 13, which represents the common output of the two bandpass filters, is coupled to the input of a subsequent mixer via a capacitance diode 17 and a coupling capacitor 19.

The circuit arrangement operates as follows: In the case of hyperband operation a positive voltage is applied to the switching diode 83 in the hyperbandpass filter 1 via the resistor 97, so that the switching diode becomes conducting. Only the hyperband signal now reaches the point 13. Tuning may be effected with the tunable circuits 5 and 15. The capacitor 85 is used to block the D.C. switching voltage applied through the resistor 97. When the switching diode 83 is conducting the hyperbandpass filter 1 has a smaller output reactance, which is in parallel with the inductances 51, 47 and 53 of the VHF bandpass filter 7 and leads to a detuning of this filter. A condiction therefor is that the VHF bandpass filter is switched to the BI range of the VHF band, i.e. no switching voltage is applied to the switching diodes 65 and 66, via the resistor 69.

For operation in the VHF range no switching voltage is applied to the switching diode 83 via the resistor 97 so that the switching diode 83 is cut off, which is achieved by the positive voltage applied to the cathode via the resistor 95. The switching diode 65 and 66 of the VHF bandfilter on the one hand and the switching diode 83 of the hyperbandfilters on the other hand are therewith alternately forward-biased. The hyperbandpass filter is now non-operative or cut off and no signals of the hyperband range reach the point 13. Since the hyperbandpass filter 1 in this mode of operation has a larger reactance and since the VHF bandpass filter is dimensioned that it is tuned to the desired range in the case of a parallel arrangement of this larger output reactance of the hyperbandpass filter 1, only the VHF bandpass filter is operative, i.e. the VHF signals are passed to the common point 13. Tunig is effected by means of the tunable circuits 11 and 15.

In order to achieve a still better damping of the VHF signals in the case of operation in the hyperbandrange, i.e. when the VHF bandpass filter is cut off, the signal present at the input 9 of the VHF bandpass filter 7, can be switched off by a (not shown) pre-arranged transistor.

What is claimed is:

1. A multiband tuning system for a television, comprising:
   (a) a first tunable circuit means (5) having an input and output, for receiving at its input first signals;
   (b) a second tunable circuit means (11) having an input and output, for receiving at its input second signals;
   (c) a first bandpass filter means (1) tuned by said first tunable circuit means, for filtering said first signals and passing only signals of a first frequency band, said first bandpass filter means having an input connected to the output of said first tunable circuit means, an output, a low end between said input and output, a switching diode (83) arranged at said low end, an a voltage means for causing said switching diode to alternatively conduct and block, wherein when said voltage means causes said switching diode to conduct, said bandpass filter means has a small output reactance and passes signals within said first frequency band in accord with its tuning, and when said voltage means causes said switching diode to block, said bandpass filter means cuts off said signals of said first frequency band and has a large output reactance;
   (d) a second bandpass filter means (7) tuned by said second tunable circuit means, for filtering said second signals and passing only signals of a second frequency band, said second bandpass filter means having an input and an output, its input being connected to the output of said second tunable circuit means and its output being connected to the output of said first bandpass filter means such that said second bandpass filter is arranged in parallel with said first bandpass filter, wherein the second bandpass filter (7) passes signals within said second frequency band in accord with its tuning when said output reactance of said first bandpass filter is large, and said second bandpass filter means is detuned and cuts off said signals of said second frequency band when said output reactance of said first bandpass filter (1) is small; and (e) a common tunable circuit means (15) having an input connected to the outputs of said first and second bandpass filter means.

2. A multiband tuning system for a television, according to claim 1, wherein said common tunable circuit means has an output, further comprising:

(f) a mixer connected to the output of said common tunable circuit means.

3. A multiband tuning system for a television, according to claim 1, wherein:

said first tunable circuit means includes a first capacitance diode means;

said second tunable circuit means includes a second capacitance diode means; and said common tunable circuit means includes a third capacitance diode means.

4. A multiband tuning system for a television, according to claim 3, wherein:

said second bandpass filter means includes switching means for causing said second bandpass filter to alternatively pass only first and second frequency ranges of said second frequency band.

5. A multiband tuning system for a television, according to claim 4, wherein:

said switching means of said second bandpass filter means includes a voltage means and two switching diodes having connected anodes, said voltage means alternately causing said two switching diodes to conduct and block.

6. A multiband tuning system for a television, according to claim 5, wherein:

said second frequency band is a VHF band, and said first and second frequency ranges of said second frequency band are range I and range III.

7. A multiband tuning system for a television, according to claim 6, wherein:

said first frequency band is a hyperband.

* * * * *